United States Patent
Baer et al.

(10) Patent No.: US 6,346,183 B1
(45) Date of Patent: Feb. 12, 2002

(54) USE OF THIN CARBON FILMS AS A BOTTOM ANTI-REFLECTIVE COATING IN MANUFACTURING MAGNETIC HEADS

(75) Inventors: Amanda Baer, Campbell; Richard Hsiao; Cherngye Hwang, both of San Jose; Clinton David Snyder, Los Gatos; Hong Xu, San Jose, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/632,501

(22) Filed: Aug. 3, 2000

(51) Int. Cl.[7] ............................................... C25C 14/34
(52) U.S. Cl. ..................... 205/119; 204/192.2; 427/131
(58) Field of Search ....................... 205/119; 204/192.2; 427/131

(56) References Cited

U.S. PATENT DOCUMENTS

| 5,314,596 | A | * | 5/1994 | Shukovsky et al. ......... 204/119 |
| 5,545,307 | A | | 8/1996 | Doss et al. |
| 5,569,501 | A | | 10/1996 | Bailey et al. |
| 5,759,476 | A | | 6/1998 | Azuma et al. |

FOREIGN PATENT DOCUMENTS

| JP | 06069123 | 3/1994 |
| JP | 07307328 | 11/1995 |
| JP | 10199889 | 7/1998 |

* cited by examiner

Primary Examiner—Arun S. Phasge
(74) Attorney, Agent, or Firm—Robert O. Guillot; Oppenheimer Wolff & Donnelly LLP

(57) ABSTRACT

A fabrication method using a bottom anti-reflective coating (BARC) eliminating deleterious effects of unwanted reflected light during the photo exposure step of a photolithographic process. The BARC coating comprises a carbon coating having a thickness of 300 angstroms, deposited by a carbon ion beam deposition tool, and an initial silicon BARC coating layer having thickness of 20 angstroms deposited before the carbon coating. Where the BARC layer is utilized in a photolithographic NiFe pole tip fabrication process, a NiFe seed layer is first deposited upon a substrate. The BARC layer is then formed on the NiFe seed layer and the pole tip trench is then photolithographically created. Thereafter, the BARC layer is removed from the bottom of the trench, utilizing a reactive ion etch process, exposing the NiFe seed layer. The NiFe pole tip is then fabricated into the trench, and any remaining photoresist and BARC layer are removed.

21 Claims, 6 Drawing Sheets

USE OF THIN CARBON FILMS AS A BOTTOM ANTI-REFLECTIVE COATING IN MANUFACTURING MAGNETIC HEADS

BACKGROUND OF THE INVENTION

1. Field of the Invention

The present invention relates generally to methods for fabricating thin film magnetic heads, and more particularly to the use of anti-reflective coatings in photolithographic process steps for fabricating narrow components such as pole tips of magnetic heads.

2. Description of the Prior Art

The magnetic pole pieces of thin film magnetic heads are generally fabricated utilizing photolithographic techniques that are well known to those skilled in the art. The ongoing efforts to increase the areal data storage density on magnetic media has led to a need to fabricate magnetic pole pieces with a smaller width, because the width of the pole pieces, particularly the P2 pole tip width, generally determines the track width of the data track written by the magnetic head. A problem that occurs in the use of photolithographic techniques in fabricating components with such small dimensions is the unwanted reflection of the exposing light energy from the surface of the substrate upon which the photolithographic resist is formed. The reflected light can expose the photoresist in unintended areas, thus degrading the accuracy of the photolithographic process. The present invention solves this problem through the use of a bottom antireflection coating (BARC) in the photolithographic process.

The use of BARC coating in the semiconductor process industry for making integrated circuits and the like is well known. However the use of such BARC coatings in the magnetic head fabrication industry, as well as the particular BARC coating process parameters described herein has not heretofore been accomplished.

SUMMARY OF THE INVENTION

The fabrication method of the present invention involves the utilization of a bottom antireflective coating (BARC) to eliminate the deleterious effects of unwanted reflected light during the photo exposure step of a photolithographic process. The BARC coating is particularly effective where small components, such as a pole tip of a magnetic head, are photolithographically fabricated. The BARC coating of the present invention is comprised of a carbon coating having a thickness of approximately 300 angstroms, and to obtain good adherence of the carbon coating to a substrate layer, an initial coating layer of silicon is deposited before the carbon coating. The silicon coating layer is formed with a thickness of approximately 20 angstroms. A carbon ion beam deposition tool is preferably utilized to deposit the carbon layer. Where the BARC layer is utilized in a photolithographic process to fabricate a NiFe pole tip, a NiFe seed layer is first deposited upon a substrate, such as the write gap layer of a magnetic head. An adhesion layer may be deposited prior to the NiFe seed layer if necessary. The BARC layer of the present invention is then formed on the NiFe seed layer and the pole tip trench is then photolithographically created. The BARC layer eliminates reflected light during the photoexposure step, resulting in more faithfully reproduced trench walls. Thereafter, the BARC layer is removed from the bottom of the trench, utilizing a reactive ion etch process, such that the surface of the NiFe seed layer is exposed. The NiFe pole tip is then fabricated into the trench, and thereafter the remaining photoresist and the remaining BARC layer are removed. The use of the BARC layer therefore is not apparent in the finally fabricated magnetic head; however, the dimensional characteristics of the pole tip are improved.

It is an advantage of the fabrication method of the present invention that increased accuracy is obtained in the photolithographic fabrication of small components of magnetic heads.

It is another advantage of the fabrication method of the present invention that a carbon BARC antireflective coating has been developed for use in the photolithographic fabrication of magnetic head components.

It is a further advantage of the fabrication method of the present invention that it utilizes a BARC coating comprised of carbon.

It is yet another advantage of the fabrication method of the present invention that it utilizes carbon and carbon deposition tools that are generally already utilized in the fabrication of magnetic heads, such that new fabrication tools and chemistries are not introduced into the magnetic head manufacturing process.

These and other features and advantages of the present invention will no doubt become well understood by those skilled in the art upon reading the following detailed description which makes reference to the several figures of the drawings.

IN THE DRAWINGS

DETAILED DESCRIPTION OF THE PREFERRED EMBODIMENTS

The written track width of a magnetic head is generally determined by the width of the P2 pole tip, as is well known to those skilled in the art. Such pole tips are photolithographically fabricated, and where it is attempted to fabricate pole tips with narrow widths, reflected light in the photoexposure step can prevent the accurate formation of such narrow pole tips. The present invention teaches the utilization of a bottom antireflective coating (BARC) in the photolithographic process to eliminate light reflection in the photoexposure step, as is described in detail herebelow.

Figure 1:
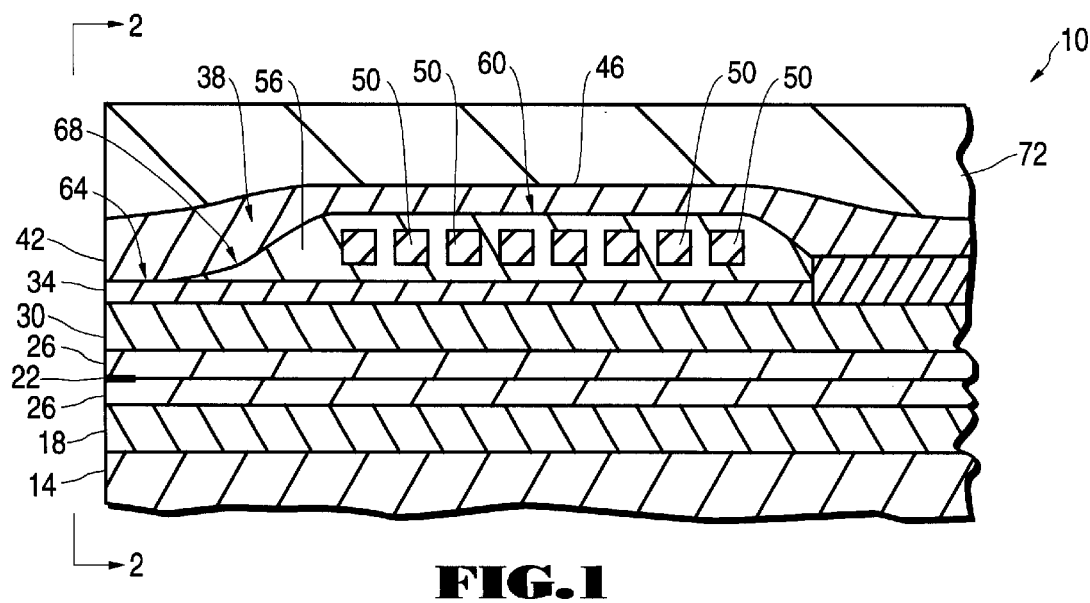
FIG. 1 is a side cross-sectional view of a standard prior art magnetic head.
Figure 2:
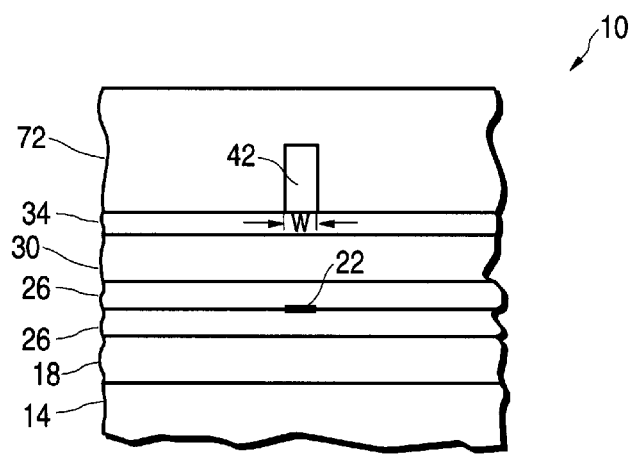
FIG. 2 is an end elevational view of the prior art magnetic head depicted in FIG. 1.

A cross-sectional view of a standard prior art magnetic head is presented in FIG. 1 to provide a contextural understanding of the present invention, and an end elevational view of the magnetic head is presented in FIG. 2. As depicted in FIGS. 1 and 2 the magnetic head 10 includes a slider substrate 14 upon which are formed a first shield layer 18, a read head element 22 (formed within insulation layers 26), a second read head shield layer 30 which also functions as a first write head magnetic pole (P1) layer 30, a write gap layer 34 and a second P2 pole layer 38 which includes a P2 pole tip portion 42 and a yoke portion 46. Induction coils 50 are disposed between the P1 pole layer 30 and the yoke 46 of the P2 pole layer 38, such that the P2 pole 38 is formed upon an insulator layer 56 having a topology which includes a relatively flat yoke surface 60, a relatively flat P2 pole tip surface 64, and a sloped surface 68 that is formed between the yoke 46 and the P2 pole tip 42. An encapsulation layer 72 encloses the magnetic head components. As is best seen in FIG. 2, the P2 pole tip 42 is quite narrow, because it is the width w of the P2 pole tip 42 that determines the width of the data track that is written onto magnetic media. It is in the ongoing efforts to reduce the width w of the P2 pole tip 42 that the reflection of light energy in the photolithographic fabrication process becomes problematic, as is best seen with the aid of FIGS. 3 & 4 and next discussed.

Figure 3:
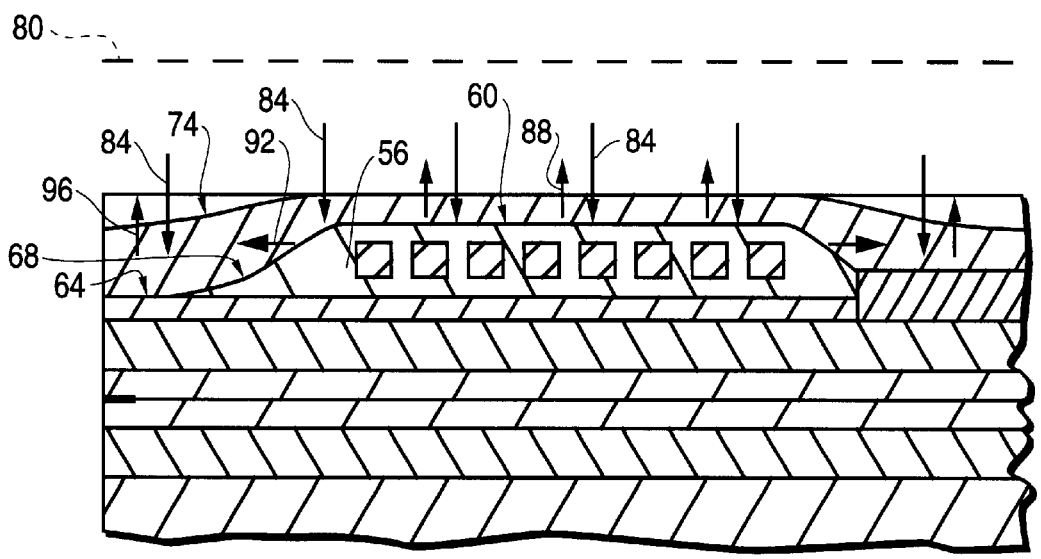
FIG. 3 is a side cross-sectional view depicting the photoexposure step of a photolithographic process for fabricating a pole tip of a magnetic head.
Figure 4:
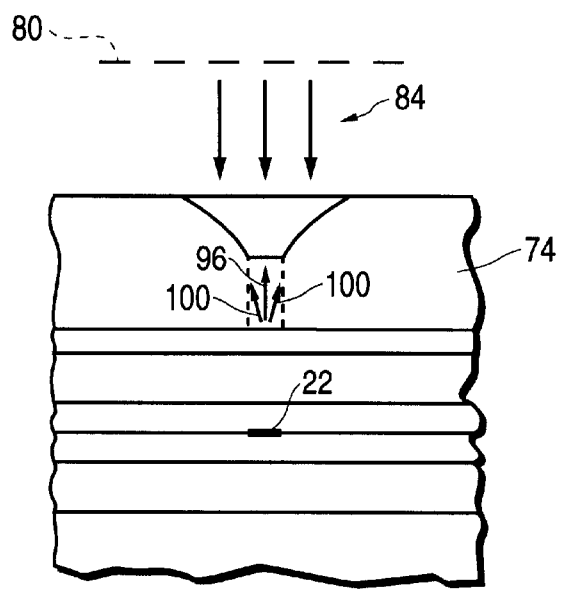
FIG. 4 is an end elevational view of the photoexposure step depicted in FIG. 3.

FIGS. 3 and 4 depict a stage in the standard prior art photolithographic process for fabricating the P2 pole of the magnetic head depicted in FIGS. 1 and 2, and common structures are numbered identically. As is seen FIGS. 3 and 4, a photoresist layer 74 has been deposited upon the insulation layer 56 in preparation for forming the P2 pole tip 42. In the light exposure step of the photolithographic process, light energy 84 is projected through a photomask 80 (depicted in phantom). The light energy 84 is incident upon the photoresist above the yoke portion 60, the sloped portion 68 and the P2 pole tip portion 64 of the device. Reflected light 88 from yoke portion 60 passes generally upwardly whereas light 92 reflected from the sloped portion 68 passes downwardly toward the P2 pole tip 42, and light 96 reflected in the flat P2 pole tip region 64 passes generally upwardly although some light 100 reflects off-normal (see FIG. 4). The unwanted reflected light 92 and 100 therefore illuminates the photoresist in unintended areas of the P2 pole tip region 64, and causes an uncontrollable degradation in the narrow dimensions that are sought to be achieved at the P2 pole tip region 64. This degradation occurs both in the flat P2 pole tip areas 64 due to the off-normal reflected light 100, as well as the sloped areas 68 where light 92 is angularly reflected. Thereafter, when the photoresist 74 is developed the hoped for narrow dimensions and vertical trench walls of the P2 pole tip region 64 are degraded due to the reflected light 92 and 100. While light reflection during the photoresist process has been known whenever photolithographic process have been used in manufacturing magnetic heads, such light reflection has not been particularly problematic until the fabrication of magnetic heads with exceedingly narrow P2 pole tip widths have been attempted. The use of the bottom antireflective coating of the present invention solves this problem and is next described with the aid of FIGS. 5 through 10.

Figure 5:
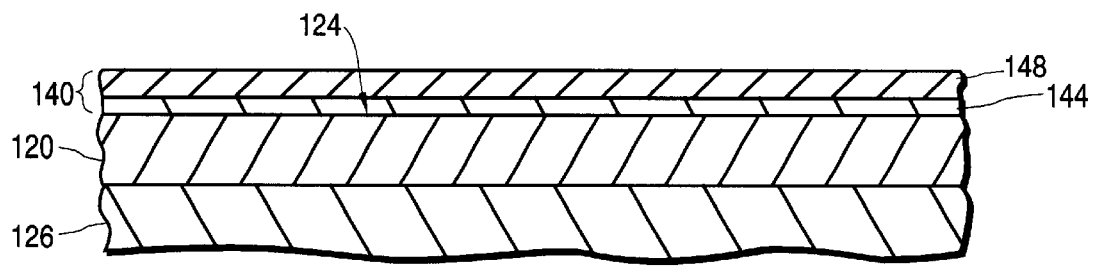
FIGS. 5–10 depict a series of fabrication steps of the present invention for photolithographically forming a narrow structure such as the P2 pole tip of a magnetic head, wherein a carbon BARC coating is advantageously utilized.

FIGS. 5 through 10 depict the fabrication steps for photolithographically forming a narrow structure such as the P2 pole tip of a magnetic head. As depicted in FIG. 5, a generalized substrate layer 120 having an upper surface 124 for the deposition of a structure such as the P2 pole tip is presented upon a supporting layer 126. The layer 120 may therefore be the write gap layer 34 and/or the insulator layer 56 of a magnetic head, and may be composed of a material such as alumina. It is therefore desired to photolithographically form a P2 pole tip structure upon the top surface 124 of the alumina layer 120 that is composed of a magnetic material such as NiFe 45/55. A first step in the pole tip formation is the deposition of a seed layer 140 upon the alumina surface 124. Because a NiFe layer will generally not adhere well to an alumina surface, an initial adherence layer 144 of tantalum having a thickness of approximately 20–80 angstroms is initially deposited; titanium and perhaps other metals may alternatively serve as an adherence layer 144. Thereafter, the NiFe seed layer portion 148 having a thickness of approximately 800 angstroms is deposited.

In prior art photolithographic pole tip fabrication processes, the next step would generally be the formation of the photoresist layer on top of the seed layer 140; however, the next step in the present invention is the deposition of the bottom antireflective coating (BARC) upon the seed layer 140. A suitable material for the BARC coating of the present invention is carbon. Carbon is advantageously utilized as a BARC coating in the manufacturing of magnetic heads because the use of carbon, as well as fabrication tools for applying thin film layers of carbon, is well known and already generally in place in magnetic head fabricating facilities to create anti-wear surface coatings for magnetic heads and hard disks. Therefore, the deposition of a carbon BARC coating does not generally involve the introduction of new chemistries and/or new fabrication tools into the manufacturing process of magnetic heads. This is a significant advantage of the present invention in savings of cost and the avoidance of unpredictable manufacturing problems where new chemistries and new tools are introduced into a fabrication process.

Figure 6:
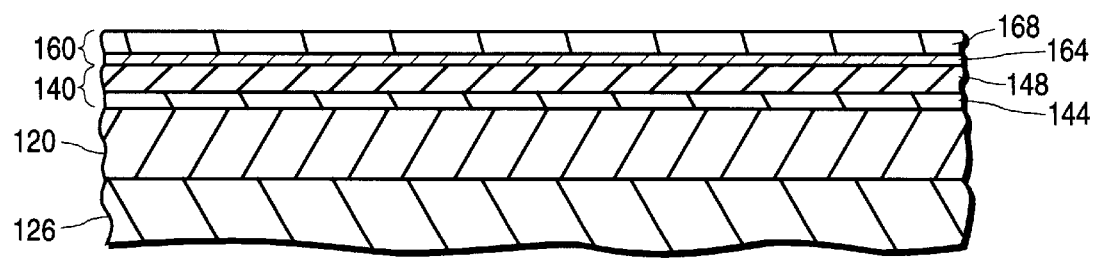

As depicted in FIG. 6 a carbon BARC coating 160 is next deposited upon the NiFe seed layer. The direct deposition of carbon onto the NiFe typically results in serious adhesion problems, in that the carbon layer will generally fail to adhere to the NiFe surface. A carbon layer is typically very compressive, and stresses within the carbon layer can cause it to detach from the seed layer and to pull up portions of the seed layer. To solve this problem, an initial layer of silicon 164, having a thickness of approximately 20 angstroms is therefore first deposited upon the NiFe layer 148. The silicon layer 164 adequately adheres to the NiFe, and thereafter a carbon coating layer 168 having a thickness of approximately 300 angstroms is deposited upon the silicon layer; the carbon will adequately adhere to the silicon layer.

Various carbon layer thicknesses from 200 angstroms to 1,000 angstroms were investigated in developing the present invention. It was determined that carbon layers of approximately 300 angstroms and approximately 800 angstroms unexpectedly performed approximately equally and somewhat better than thinner or thicker layers. The preferred embodiment of the present invention therefore utilizes a carbon layer of approximately 300 angstroms, because the layer is more rapidly and easily deposited and because it is more rapidly and easily removed than an 800 angstrom layer.

The carbon BARC coating of the present invention is preferably deposited utilizing a carbon ion beam deposition tool Such tools are currently utilized to apply the carbon wear resistant coatings in magnetic head and magnetic hard disk fabrication processes as mentioned above. Other carbon deposition processes, such as sputter deposited carbon and PECVD processes can alternatively be utilized, however the carbon ion beam deposition process results in a smooth, uniform coating that is preferred. Another reason for preferring the 300 angstrom carbon BARC coating thickness is because the carbon ion beam deposition tools are typically utilized to deposit thin films on the order of 100 angstroms. The deposition of a 300 angstrom carbon film is therefore generally within the performance characteristics of such tools, whereas the deposition of an 800 angstrom coating is somewhat more difficult with such tools.

With regard to process parameters of the carbon ion beam deposition tool, it was found that the use of commonly utilized and well known process parameters for depositing the wear resistance coating were entirely suitable for the deposition of the 300 angstrom carbon BARC coating of the present invention. Therefore, the use of a carbon ion beam deposition tool manufactured by Veeco Instruments, Inc., and operating with the following general process parameters is suitable for the deposition of the carbon BARC of the present invention. It has been found that the carbon ion beam deposition tool, operating with a beam voltage of 250–300 volts, with a beam current of 240–360 mA, and a suppressor voltage of 400 volts, together with a $CH_4$ flow rate of 50–90 sccm provides a carbon film with suitable antireflective properties.

Figure 7:
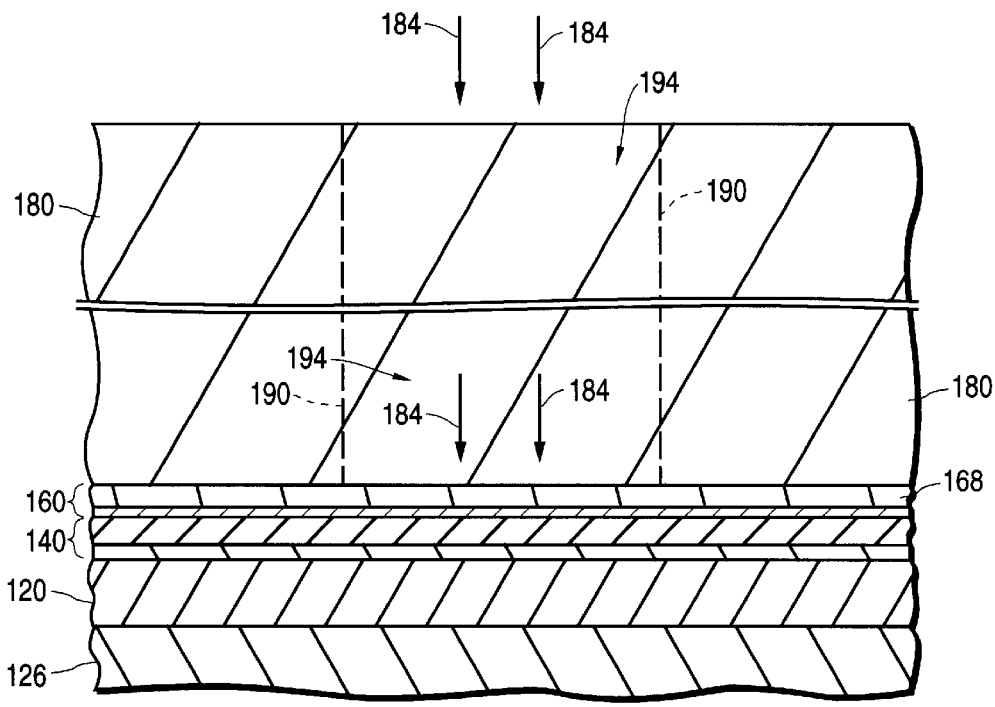
Figure 8:
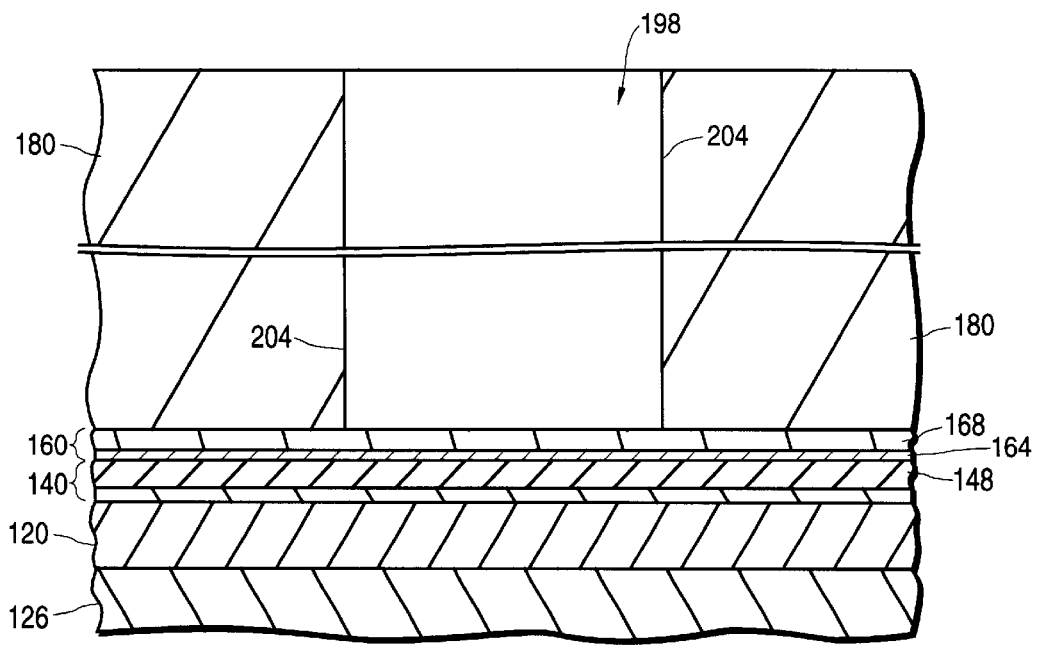

Following the deposition of the carbon BARC coating 168, standard photolithographic techniques are utilized to form the trench for the following component fabrication. FIG. 7 depicts a photolithographic exposure step in which a photoresist layer 180 deposited upon the carbon BARC coating 168 is exposed to light 184. The phantom trench wall lines 190 depict the edge of light exposure, and it is significant that no light is reflected from the carbon BARC coating 168. Following the light exposure step the photoresist layer is developed and the exposed photoresist 194 is removed. FIG. 8 depicts the fabrication stage in which the trench 198 is formed by the photoresist removal. The trench walls 204 are more vertical and smoother than the prior art fabrication process walls due to the BARC layer 160 of the present invention.

At this point, the BARC layer 160 has performed its purpose of eliminating light reflection during the photoexposure step. Now, prior to the fabrication of the component within the trench, the BARC layer 160 must be removed from the bottom of the trench, such that a good electomagnetic connection can be made between the NiFe seed layer 148 and the component that is formed within the trench 198. To remove the BARC layer an RIE process is next performed. In the preferred embodiment, an oxygen RIE process step is utilized to remove the carbon layer portion 168 of the BARC 160, although other oxidizing gases such as carbon dioxide are suitable. The silicon layer portion 164 of the BARC 160 is generally somewhat resistant to oxygen RIE, and a fluorine gas RIE may be preferentially utilized to remove it, such that the surface 208 of the NiFe seed layer is exposed. Where the surface of the NiFe seed layer is significantly oxidized, it may be necessary to utilize a hydrogen gas reducing RIE upon that surface to promote good electromagnetic conduction.

Figure 9:
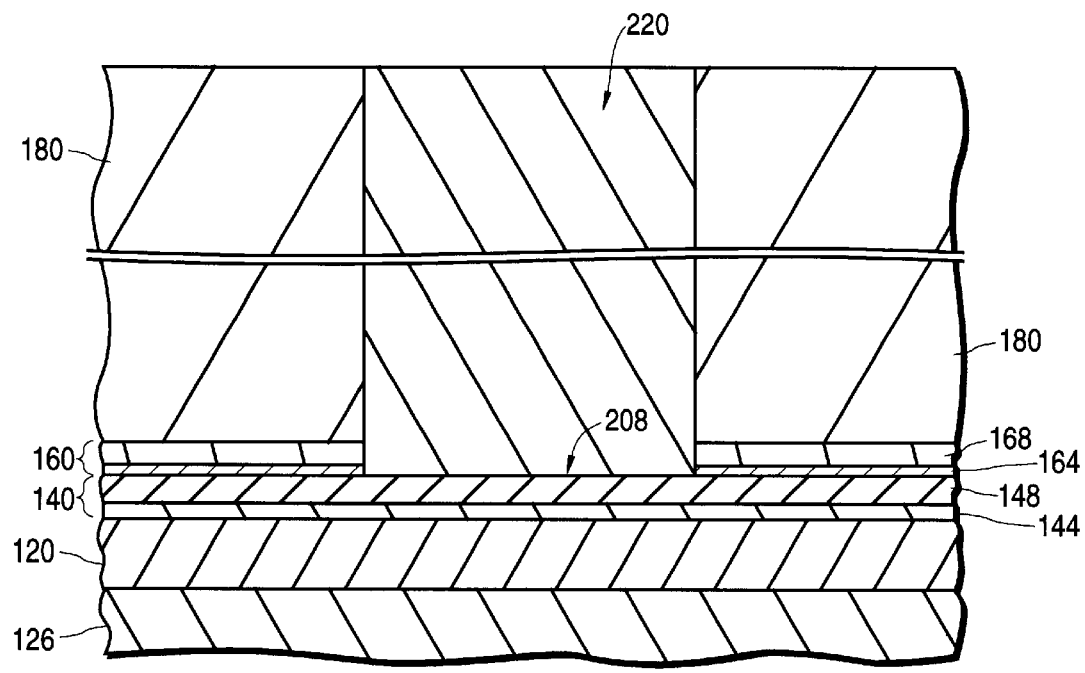
Figure 10:
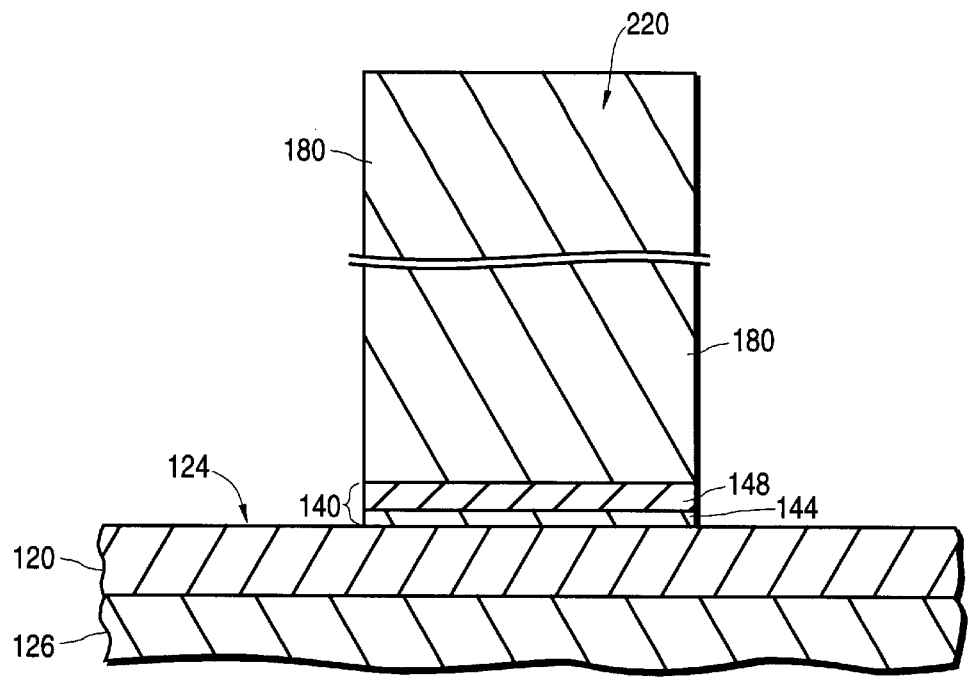

As is next depicted in FIG. 9, following the removal of the BARC layer from the bottom of the photolithographic trench 198, the pole tip component 220 is plated up into the trench utilizing standard process techniques and parameters, as are well known to those skilled in the art. Thereafter, as depicted in FIG. 10, the photoresist layer is removed, such that the remaining BARC layer and seed layer therebelow remain and are exposed. The BARC carbon and silicon layers are removed utilizing a similar RIE process to that which was utilized to remove the BARC layers from the bottom of the trench; that is, utilizing and oxidizing RIE such as with oxygen, followed by fluorine if necessary to remove the silicon layer. Thereafter, the remaining NiFe seed layer and tantalum adhesion layer are removed utilizing standard process techniques, such as by sputter etching, as is well known to those skilled in the art.

As can be understood from the device as depicted in FIG. 10, the BARC process of the present invention is transparent in the final product. That is, while the BARC process of the present invention adds new process steps, there is no indication in the final device that an antireflective coating was used in the fabrication process, and the final device is substantially identical to the devices resulting from the pre-existing fabrication processes. A significant difference however in the final device produced utilizing the process of the present invention is that the narrow structural components, such as a 0.25 micron width P2 pole tip 220 are more accurately and more reliably fabricated.

Figure 11:
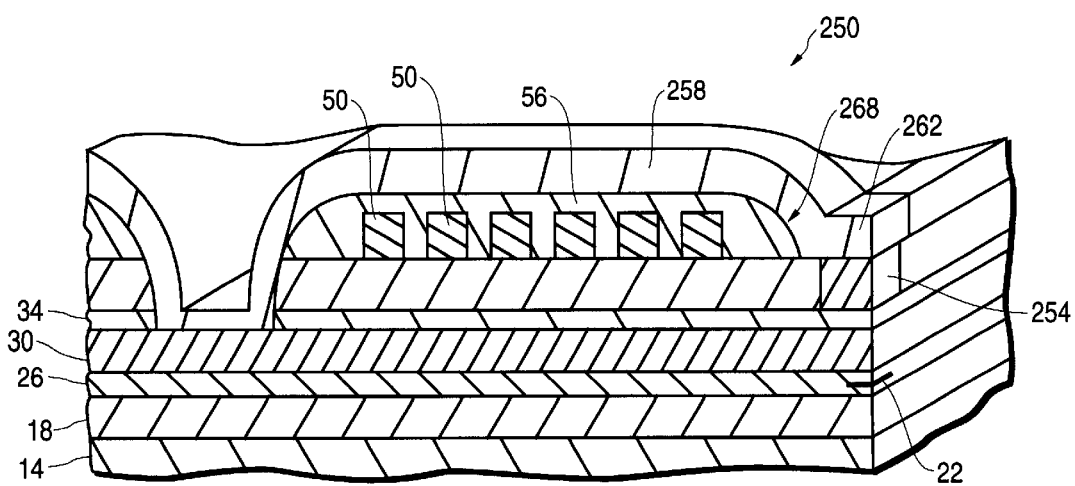
FIG. 11 is a perspective view depicting a T-head design, wherein the antireflective coating process of the present invention is advantageously utilized.

The antireflective coating of the present invention can be advantageously utilized in the fabrication of a T-head design for a magnetic head, and a perspective view of such a T-head design 250 is provided in FIG. 11. A basic feature of the T-head design 250 is that a P2 pole tip 254 is separately fabricated in a photolithographic process, followed by the photolithographic fabrication of the yoke portion 258 of the P2 pole. In this T-head design, the yoke portion 258 is commonly referred to as the P3 pole. The T-head design 250 is attractive because the P2 pole tip is separately fabricated with a lower aspect ratio (trench wall height to width) than the device depicted in FIGS. 5–10, such that a narrow P2 pole tip can be more accurately fabricated. The P3 pole 258 includes a pole tip portion 262 that is fabricated in magnetic connection with the P2 pole tip 254, such that magnetic flux can flow between the P3 pole and the P2 pole tip. Because the P3 pole is fabricated on top of the inductive coils 50 and insulative layer 56, the P3 pole 258 includes a sloped portion 268, and such a sloped portion 268 can lead to the reflected light problems described hereabove. Therefore, the use of an antireflective coating, as is next described, in the fabrication of the P3 pole of a T-head design is advantageous, as is next described.

Initially, the P2 pole tip 254 is fabricated upon a write gap layer 34, and an insulative layer 274 is fabricated to the thickness of the P2 pole tip. Thereafter, induction coil traces are fabricated, and an insulative layer 56 is deposited upon the induction coil traces 50, such that the insulative layer 56 slopes downwardly 268 to an exposed top surface of the P2 pole tip. To fabricate the P3 pole 258, a NiFe seed layer (which may require an initial adhesion layer) is first deposited. An antireflective coating of the present invention is next deposited upon the top surface of the NiFe layer. As described in detail hereabove, the antireflective layer preferably includes a first adhesion layer composed of silicon and a subsequent antireflective layer composed of carbon. The thicknesses and fabrication parameters provided hereabove are suitable for this anti-reflective coating. Thereafter, utilizing photolithographic techniques, as have been described hereabove, a patterned photoresist is fabricated upon the antireflective layer such that a P3 pole trench is formed above the insulative layer 56, the sloped portion 268 and the top surface of the P2 pole tip 254. Thereafter, utilizing RIE techniques described hereabove, the carbon and silicon antireflective coating layers are removed from the bottom of the P3 pole trench. Thereafter, the P3 pole is fabricated utilizing electroplating techniques into the P3 pole trench. Following the fabrication of the P3 pole, the remaining photoresist material is removed, and the remaining antireflective layer is subsequently removed utilizing RIE processing as discussed hereabove. Thereafter, the NiFe seed layer is likewise removed in areas that were under the photoresist, as has been described hereabove.

The T-head design, as depicted in FIG. 11, includes no indication in the final device that the antireflective coating of the present invention was used in the fabrication process. However, the P3 pole 258, and particularly the P3 pole tip 262 is more accurately and more reliably fabricated due to the use of the antireflective coating of the present invention.

Figure 12:
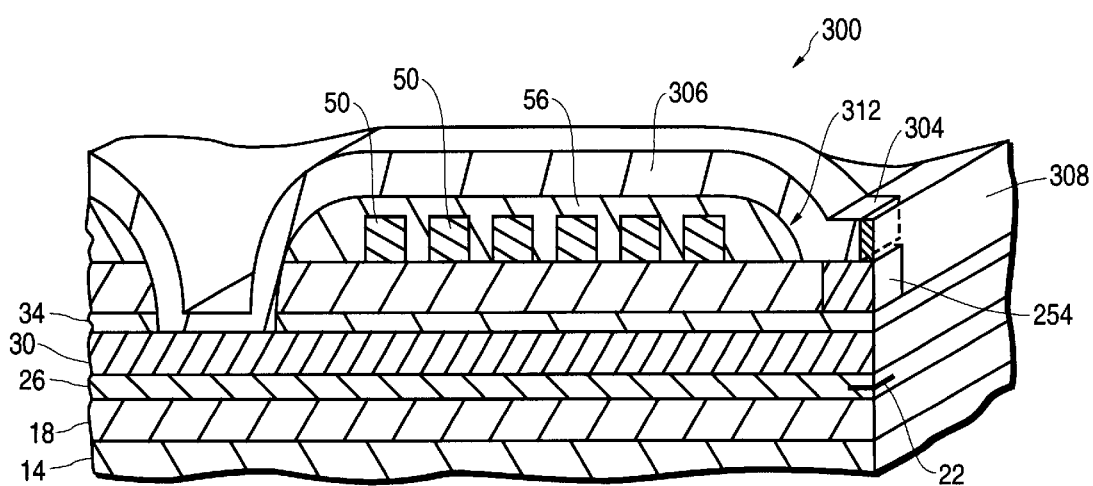
FIG. 12 is a perspective view depicting an alternative T-head design, including a recessed P3 layer, wherein the antireflective coating of the present invention is advantageously utilized.

FIG. 12 depicts a perspective view of an alternative T-head design 300 of the present invention. A comparison of FIG. 12 with FIG. 11 reveals that the significant difference between the T-head design of FIGS. 11 and 12 is that the P3 pole tip 304 of the P3 pole 306 of the T-head design 300 of FIG. 12 is recessed from the subsequently formed ABS surface 308, as compared to the P3 pole tip 262 of the T-head design 250 depicted in FIG. 11. However, the significant similarity between the T-heads 300 and 250 is that they each contain a P3 pole 306 and 258 having a sloped portion 312 and 268 respectively. The utilization of the antireflective coating of the present invention in fabricating the recessed P3 pole tip T-head design 300 depicted in FIG. 12 provides similar advantages to the use of the anti-reflective coating in fabricating the T-head design 250 depicted in FIG. 11. That is, the use of the antireflective coating results in a more accurate and reliably fabricated P3 pole tip 304. The process steps in the fabrication and utilization of the anti-reflective coating of the present invention in fabricating the T-head design 300 depicted in FIG. 12 will be well understood by those skilled in the art having read and understood the use of the antireflective coating in fabricating the T-head 250 depicted in FIG. 11, and a detailed description thereof is therefore deemed unnecessary.

While the present invention has been shown and described with reference to certain preferred embodiments, it is to be understood that those skilled in the art will develop various alterations and modifications in form and detail hereto. It is therefore intended that the following claims include all such alterations and modifications that nevertheless include the true spirit and scope of the present invention.

What we claim is:

1. A method for fabricating a magnetic head comprising the steps of:
    fabricating a substrate layer of said magnetic head upon which a photolithographically fabricated component is to be formed;
    depositing a carbon bottom antireflection coating (BARC) coating upon said substrate layer;
    depositing a photoresist layer upon said carbon BARC coating;
    exposing said photoresist layer to light energy in a photolithographic exposure step;
    developing and removing photoresist material deposited above said carbon BARC coating;
    removing said carbon BARC coating in areas where said photoresist has been removed;
    forming said component in areas where said carbon BARC coating has been removed;
    removing remaining portions of said photoresist layer;
    removing remaining portions of said carbon BARC coating; and
    fabricating further components of said magnetic head.

2. A method for fabricating a magnetic head as described in claim 1 wherein said carbon BARC coating has a thickness from approximately 200 angstroms to approximately 1,000 angstroms.

3. A method for fabricating a magnetic head as described in claim 1 wherein said carbon BARC coating has a thickness selected from the group consisting of approximately 300 angstroms and approximately 800 angstroms.

4. A method for fabricating a magnetic head as described in claim 1 wherein said carbon BARC coating has a thickness of approximately 300 angstroms.

5. A method for fabricating a magnetic head as described in claim 1 wherein said carbon BARC coating is deposited using a carbon ion beam deposition tool.

6. A method for fabricating a magnetic head as described in claim 1 including the further step of depositing a silicon layer upon said substrate prior to depositing said carbon BARC coating thereon, such that said carbon BARC coating is deposited upon said silicon layer.

7. A method for fabricating a magnetic head as described in claim 6 wherein said silicon layer has a thickness of approximately 20 angstroms.

8. A method for fabricating a pole tip of a magnetic head comprising the steps of:
    fabricating a substrate layer of said magnetic head upon which a pole tip is to be fabricated;
    depositing a seed layer upon said substrate layer;
    depositing a carbon BARC coating upon said seed layer;
    depositing a photoresist layer upon said carbon BARC coating;
    exposing said photoresist layer to light energy in a photolithographic exposure step;
    developing and removing photoresist material deposited above said carbon BARC coating;
    removing said carbon BARC coating in areas where said photoresist has been removed;
    forming said pole tip in areas where said carbon BARC coating has been removed;
    removing remaining portions of said photoresist layer;
    removing remaining portions of said carbon BARC coating; and
    fabricating further components of said magnetic head.

9. A method for fabricating a magnetic head as described in claim 8 wherein said carbon BARC coating has a thickness from approximately 200 angstroms to approximately 1,000 angstroms.

10. A method for fabricating a magnetic head as described in claim 8 wherein said carbon BARC coating has a thickness selected from the group consisting of approximately 300 angstroms and approximately 800 angstroms.

11. A method for fabricating a magnetic head as described in claim 8 wherein said carbon BARC coating has a thickness of approximately 300 angstroms.

12. A method for fabricating a magnetic head as described in claim 11 wherein said carbon BARC coating is deposited using a carbon ion beam deposition tool.

13. A method for fabricating a magnetic head as described in claim 11 including the further step of depositing a silicon layer upon said substrate prior to depositing said carbon BARC coating thereon, such that said carbon BARC coating is deposited upon said silicon layer.

14. A method for fabricating a magnetic head as described in claim 13 wherein said silicon layer has a thickness of approximately 20 angstroms.

15. A method for fabricating a magnetic head as described in claim 8 wherein said seed layer includes a NiFe thin film portion.

16. A method for fabricating a magnetic head as described in claim 15 wherein said seed layer includes a tantalum thin film portion that is deposited upon said substrate layer, and wherein said NiFe thin film portion is deposited upon said tantalum thin film portion.

17. A method for fabricating a magnetic head comprising the steps of:

fabricating a read head component upon a substrate layer;

fabricating a first magnetic pole upon said read head component;

fabricating a write gap layer upon said first magnetic pole;

depositing a seed layer upon said write gap layer, said seed layer including a portion formed of NiFe;

forming a BARC coating upon said seed layer, said BARC coating including a first coating portion comprised of silicon that is deposited upon said NiFe seed layer, said silicon coating portion having a thickness of approximately 20 angstroms;

depositing a second portion of said BARC coating upon said silicon portion, said second portion being comprised of carbon and having a thickness of approximately 300 angstroms;

depositing a photoresist layer upon said carbon BARC coating;

exposing said photoresist layer to light energy in a photolithographic exposure step;

developing and removing photoresist material deposited above said carbon BARC coating;

removing said carbon BARC coating in areas where said photoresist has been removed, utilizing a reactive ion etch (RIE) process;

forming a pole tip in areas where said carbon BARC coating has been removed;

removing remaining portions of said photoresist layer;

removing remaining portions of said carbon BARC coating in areas where said remaining portions of said photoresist layer were removed;

removing remaining portions of said seed layer in areas where said remaining portions of said photoresist layer were removed; and fabricating further components of said magnetic head.

18. A method for fabricating a magnetic head as described in claim 17, wherein said steps of removing said carbon BARC coating utilizes a reactive ion etch (RIE) process including oxygen and fluorine ions.

19. A method for fabricating a magnetic head comprising the steps of:

fabricating a read head component upon a substrate layer;

fabricating a first magnetic pole upon said read head component;

fabricating a write gap layer upon said first magnetic pole;

fabricating a P2 pole tip upon said write gap layer;

depositing a seed layer upon said P2 pole tip, said seed layer including a portion formed of NiFe;

forming a BARC coating upon said seed layer, said BARC coating including a first coating portion comprised of silicon that is deposited upon said NiFe seed layer, said silicon coating portion having a thickness of approximately 20 angstroms;

depositing a second portion of said BARC coating upon said silicon portion, said second portion being comprised of carbon and having a thickness of approximately 300 angstroms;

depositing a photoresist layer upon said carbon BARC coating;

exposing said photoresist layer to light energy in a photolithographic exposure step;

developing and removing photoresist material deposited above said carbon BARC coating;

removing said carbon BARC coating in areas where said photoresist has been removed, utilizing a reactive ion etch (RIE) process;

forming a P3 pole in areas where said carbon BARC coating has been removed;

removing remaining portions of said photoresist layer;

removing remaining portions of said carbon BARC coating in areas where said remaining portions of said photoresist layer were removed;

removing remaining portions of said seed layer in areas where said remaining portions of said photoresist layer were removed; and fabricating further components of said magnetic head.

20. A method for fabricating a magnetic head as described in claim 19, wherein said steps of removing said carbon BARC coating utilizes a reactive ion etch (RIE) process including oxygen and fluorine ions.

21. A method for fabricating a magnetic head as described in claim 19, wherein a pole tip portion of said P3 pole is recessed away from an air bearing surface of said magnetic head.

* * * * *